United States Patent
Takahashi et al.

(10) Patent No.: US 11,105,859 B2
(45) Date of Patent: Aug. 31, 2021

(54) SENSOR ABNORMALITY DETERMINATION DEVICE

(71) Applicant: TOYOTA JIDOSHA KABUSHIKI KAISHA, Toyota (JP)

(72) Inventors: Kohei Takahashi, Toyota (JP); Takayuki Akaishi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/882,803

(22) Filed: May 26, 2020

(65) Prior Publication Data

US 2021/0088590 A1 Mar. 25, 2021

(30) Foreign Application Priority Data

Sep. 19, 2019 (JP) .............................. JP2019-170430

(51) Int. Cl.
G01R 31/367 (2019.01)
G01R 31/392 (2019.01)
G01R 31/389 (2019.01)
H01M 10/48 (2006.01)

(52) U.S. Cl.
CPC ......... *G01R 31/367* (2019.01); *G01R 31/389* (2019.01); *G01R 31/392* (2019.01); *H01M 10/48* (2013.01)

(58) Field of Classification Search
None
See application file for complete search history.

(56) References Cited

U.S. PATENT DOCUMENTS

2016/0347196 A1 12/2016 Nakamura
2020/0128883 A1* 4/2020 Yamada ................ H01M 10/48

FOREIGN PATENT DOCUMENTS

JP 2016-222227 A 12/2016

* cited by examiner

*Primary Examiner* — Jas A Sanghera
(74) *Attorney, Agent, or Firm* — Oliff PLC

(57) ABSTRACT

A sensor abnormality determination device that determines abnormality in a current sensor includes an acquisition unit configured to acquire a closed circuit voltage of the battery and acquires an open circuit voltage of the battery obtained from a state of charge of the battery when the closed circuit voltage is acquired based on a predetermined SOC–OCV characteristic curve, a derivation unit configured to derive a first voltage difference which is a difference value between the closed circuit voltage and the open circuit voltage and a second voltage difference which is a change amount of a voltage obtained from a current of the battery detected by the current sensor and an internal resistance, and a determination unit configured to determine whether the current sensor is abnormal based on the first and the second voltage difference when the first voltage difference is equal to or larger than a first predetermined value.

4 Claims, 4 Drawing Sheets

SENSOR ABNORMALITY DETERMINATION DEVICE

INCORPORATION BY REFERENCE

The disclosure of Japanese Patent Application No. 2019-170430 filed on Sep. 19, 2019 including the specification, drawings and abstract is incorporated herein by reference in its entirety.

BACKGROUND

1. Technical Field

The disclosure relates to a sensor abnormality determination device that determines abnormality in a current sensor that detects a current of a battery.

2. Description of Related Art

Japanese Unexamined Patent Application Publication No. 2016-222227 (JP 2016-222227 A) discloses a device that performs abnormality diagnosis of a current sensor that detects a current flowing to a battery mounted on a vehicle. In JP 2016-222227 A, a voltage change and a current change of the battery are detected, and the presence or absence of abnormality in the current sensor is determined based on a deviation between the voltage change and the current change.

SUMMARY

There is a specific device that constantly consumes a small amount of current regardless of the voltage change of the battery among in-vehicle devices connected to the battery. For this reason, even when there is the deviation between the voltage change and the current change, when the current change of the battery is small, that is, when a current flowing out of the battery is small, it is difficult to clearly determine whether a cause of the deviation therebetween is the abnormality in the current sensor or the small amount of current consumption by the specific device (current sensor is normal). Therefore, a method in the related art based on the deviation between the voltage change and the current change of the battery has difficulty that accuracy of determining that the current sensor is abnormal is low.

The disclosure provides a sensor abnormality determination device in which accuracy of determining that a current sensor is abnormal is improved.

An aspect of the disclosure relates to a sensor abnormality determination device that determines abnormality in a current sensor that detects a current of a battery and includes an acquisition unit, a derivation unit, and a determination unit. The acquisition unit acquires a closed circuit voltage of the battery and acquires an open circuit voltage of the battery obtained from a state of charge of the battery when the closed circuit voltage is acquired based on a predetermined state of charge (SOC)–open circuit voltage (OCV) characteristic curve indicating a relationship between the state of charge and the open circuit voltage of the battery. The derivation unit derives a first voltage difference which is a difference value between the closed circuit voltage and the open circuit voltage and a second voltage difference which is a change amount of a voltage obtained from a current of the battery detected by the current sensor and an internal resistance. The determination unit determines whether the current sensor is abnormal based on the first voltage difference and the second voltage difference derived by the derivation unit when the first voltage difference is equal to or larger than a first predetermined value.

With the sensor abnormality determination device according to the aspect of the disclosure, it is possible to improve the accuracy of determining that the current sensor is abnormal.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A sensor abnormality determination device according to the aspect of the disclosure performs an abnormality determination process of a current sensor when a current flowing through a battery is estimated to be larger than a predetermined value. Accordingly, when a charge or discharge current flowing through the battery is smaller than the predetermined value, for which a cause thereof is difficult to be clearly determined, the abnormality determination process is not performed. Therefore, it is possible to improve accuracy of determining that the current sensor is abnormal.

Embodiment

Hereinafter, an embodiment of the disclosure will be described in detail with reference to drawings.

Configuration

Figure 1:
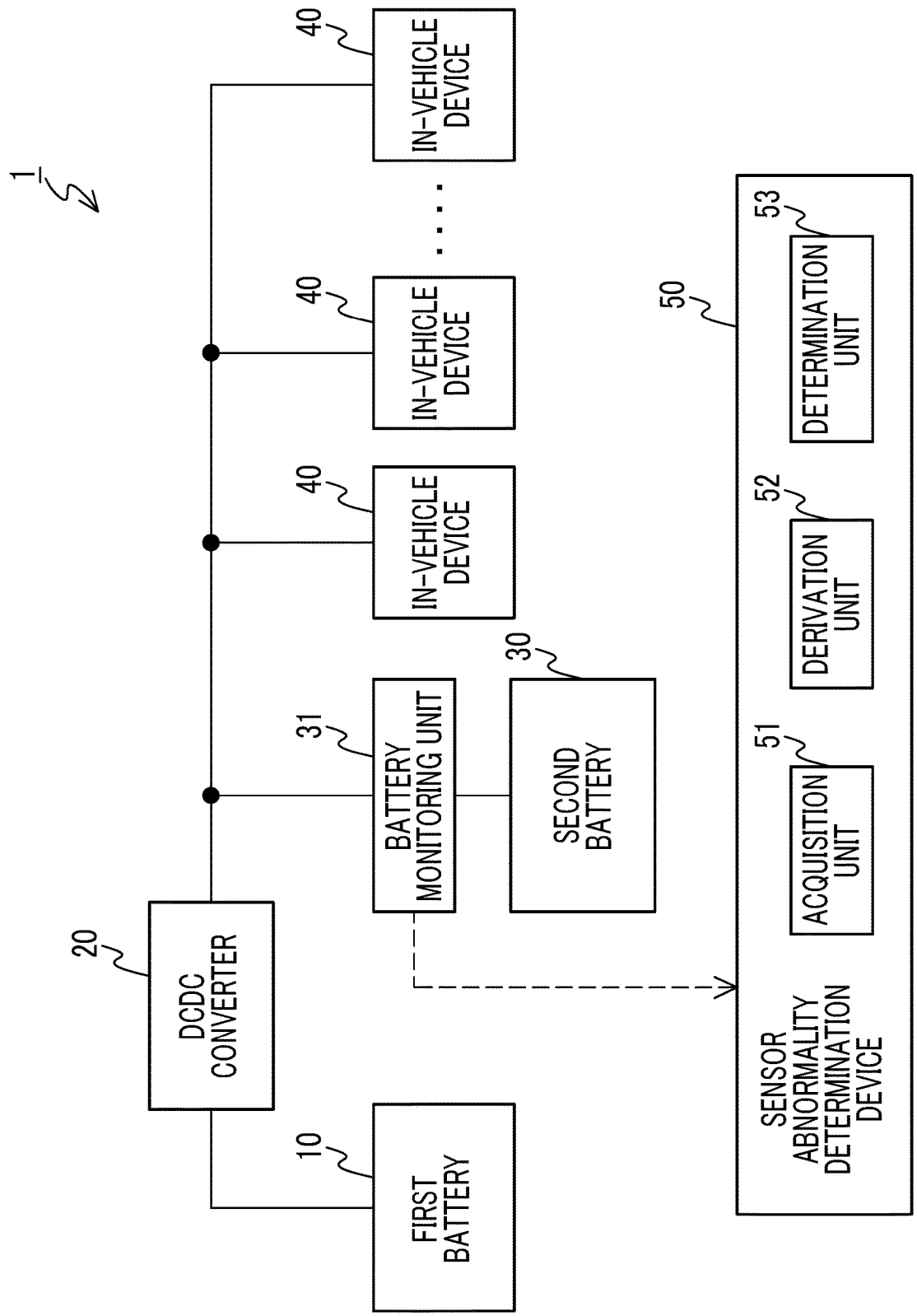
FIG. 1 is a schematic configuration diagram of a power supply system including a sensor abnormality determination device according to an embodiment of the disclosure.

FIG. 1 is a block diagram showing a schematic configuration of a power supply system including a sensor abnormality determination device according to an embodiment of the disclosure. A power supply system 1 illustrated in FIG. 1 includes a first battery 10, a DCDC converter 20, a second battery 30, a battery monitoring unit 31, a plurality of in-vehicle devices 40, and a sensor abnormality determination device 50 of the embodiment.

In the following embodiment, control of the sensor abnormality determination device 50 according to the embodiment will be described with a case where the power supply system 1 is mounted on a vehicle such as a hybrid vehicle (HV), a plug-in hybrid vehicle (PHV), and an electric vehicle (EV) that use an electric motor as a power source as an example.

The first battery 10 is a high-voltage battery for supplying electric power to the electric motor (not shown) or the DCDC converter 20. The first battery 10 may be configured to be able to acquire the electric power from an external power supply through a plug-in charger (not shown) connectable to the external power supply. A secondary battery such as a lithium ion battery configured to be chargeable and dischargeable is used as the first battery 10.

The DCDC converter 20 connects the first battery 10, the second battery 30, and the in-vehicle devices 40, and supplies the electric power of the first battery 10 to the second battery 30 and the in-vehicle devices 40. When the electric power is supplied, the DCDC converter 20 can convert a high voltage of the first battery 10 which is an input voltage into a predetermined low voltage and output the converted voltage.

Figure 2:
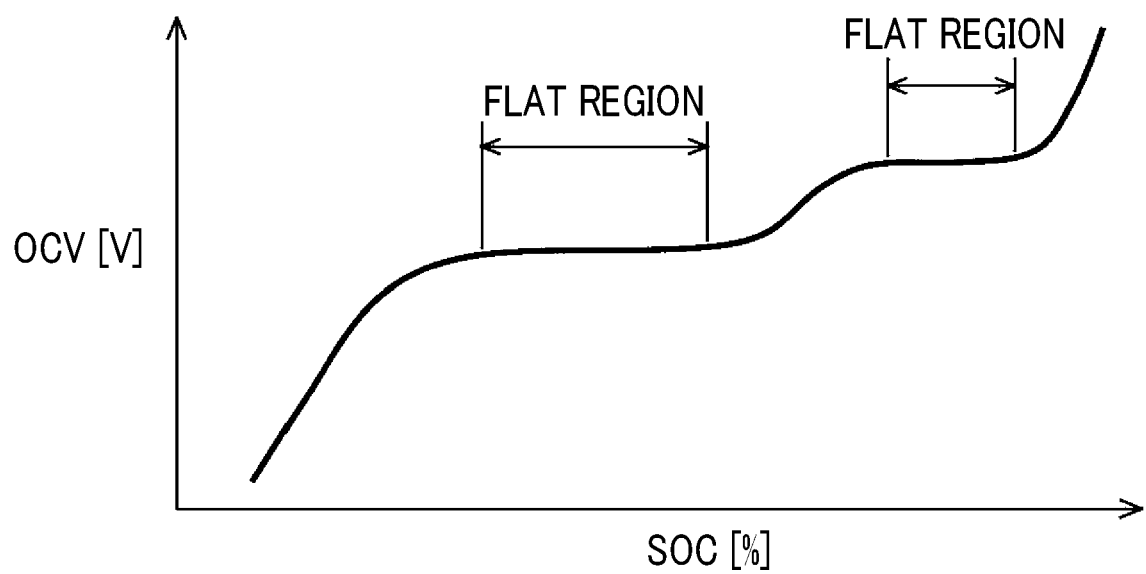
FIG. 2 is a graph showing an example of an SOC–OCV characteristic curve of a battery having flat regions.

The second battery 30 is a low-voltage battery that charges the electric power output from the DCDC converter 20 or discharges its own electric power. A battery having a flat region where a change rate of an open circuit voltage OCV with respect to a state of charge SOC is equal to or less than a predetermined value in an SOC–OCV characteristic curve indicating a relationship between the state of charge SOC and the open circuit voltage OCV of the battery, for example, an iron phosphate lithium ion battery (LFP battery) is used as the second battery 30. FIG. 2 shows an example of the SOC–OCV characteristic curve having flat regions.

The battery monitoring unit 31 monitors various states of the second battery 30. Specifically, the battery monitoring unit 31 monitors a voltage, current, and temperature of the second battery 30 using a voltage sensor, a current sensor, and a temperature sensor (not shown). The battery monitoring unit 31 monitors a degree of aging deterioration of the second battery 30 based on the number of use days, a use time, or the like. The battery monitoring unit 31 transmits various states of the second battery 30 to be monitored to the sensor abnormality determination device 50.

The in-vehicle devices 40 are various devices that are mounted on the vehicle and operated by the electric power output from the DCDC converter 20 or the electric power of the second battery 30. Examples of the in-vehicle devices 40 include actuators such as motors or solenoids, lights such as headlamps or room lights, air conditioning such as heaters and coolers, and electronic control units (ECUs) such as steering, a brake, and autonomous driving or advanced driving assistance.

Based on the state (voltage, current, temperature, deterioration degree, and the like) of the second battery 30 transmitted from the battery monitoring unit 31, the sensor abnormality determination device 50 determines whether there is the abnormality in the current sensor included in the battery monitoring unit 31. The sensor abnormality determination device 50 may be typically configured as an ECU including a processor, a memory, an input and output interface, and the like. In the sensor abnormality determination device 50 of the embodiment, the processor reads and executes a program stored in the memory to realize each function of an acquisition unit 51, a derivation unit 52, and a determination unit 53 described below.

The acquisition unit 51 acquires a value detected by the voltage sensor of the battery monitoring unit 31 as a closed circuit voltage CCV of the second battery 30. The acquisition unit 51 acquires an open circuit voltage OCV of the second battery 30. The open circuit voltage OCV can be obtained from the state of charge SOC of the second battery 30 when the closed circuit voltage CCV is acquired, based on the SOC–OCV characteristic curve of the second battery 30. The state of charge SOC can be easily acquired using a well-known OCV method, current integration method, or the like. The acquisition unit 51 can acquire a current I of the second battery 30 detected by the current sensor of the battery monitoring unit 31 and a temperature T of the second battery 30 detected by the temperature sensor of the battery monitoring unit 31, respectively. The current I in the embodiment is expressed as a signed value with a direction flowing into the second battery 30 as a positive direction and a direction flowing out of the second battery 30 as a negative direction.

The derivation unit 52 derives a first voltage difference $\Delta V1 (=CCV-OCV)$ which is a difference value between the closed circuit voltage CCV and the open circuit voltage OCV from the closed circuit voltage CCV and the open circuit voltage OCV acquired by the acquisition unit 51. The derivation unit 52 derives a second voltage difference $\Delta V2$ $(=I \times R)$ which is a change amount of a voltage obtained from the current I flowing into and out of the second battery 30 acquired by the acquisition unit 51 and an internal resistance R of the second battery 30. The internal resistance R of the second battery 30 can be derived, for example, using a predetermined battery resistance map in which the internal resistance R corresponding to the battery temperature T, the state of charge SOC, and the deterioration degree is set in advance.

The determination unit 53 determines the presence or absence of the abnormality in the current sensor based on the first voltage difference $\Delta V1$ and the second voltage difference $\Delta V2$ derived by the derivation unit 52. The determination of the presence or absence of the abnormality in the current sensor is performed as follows.

Control

Figure 3:
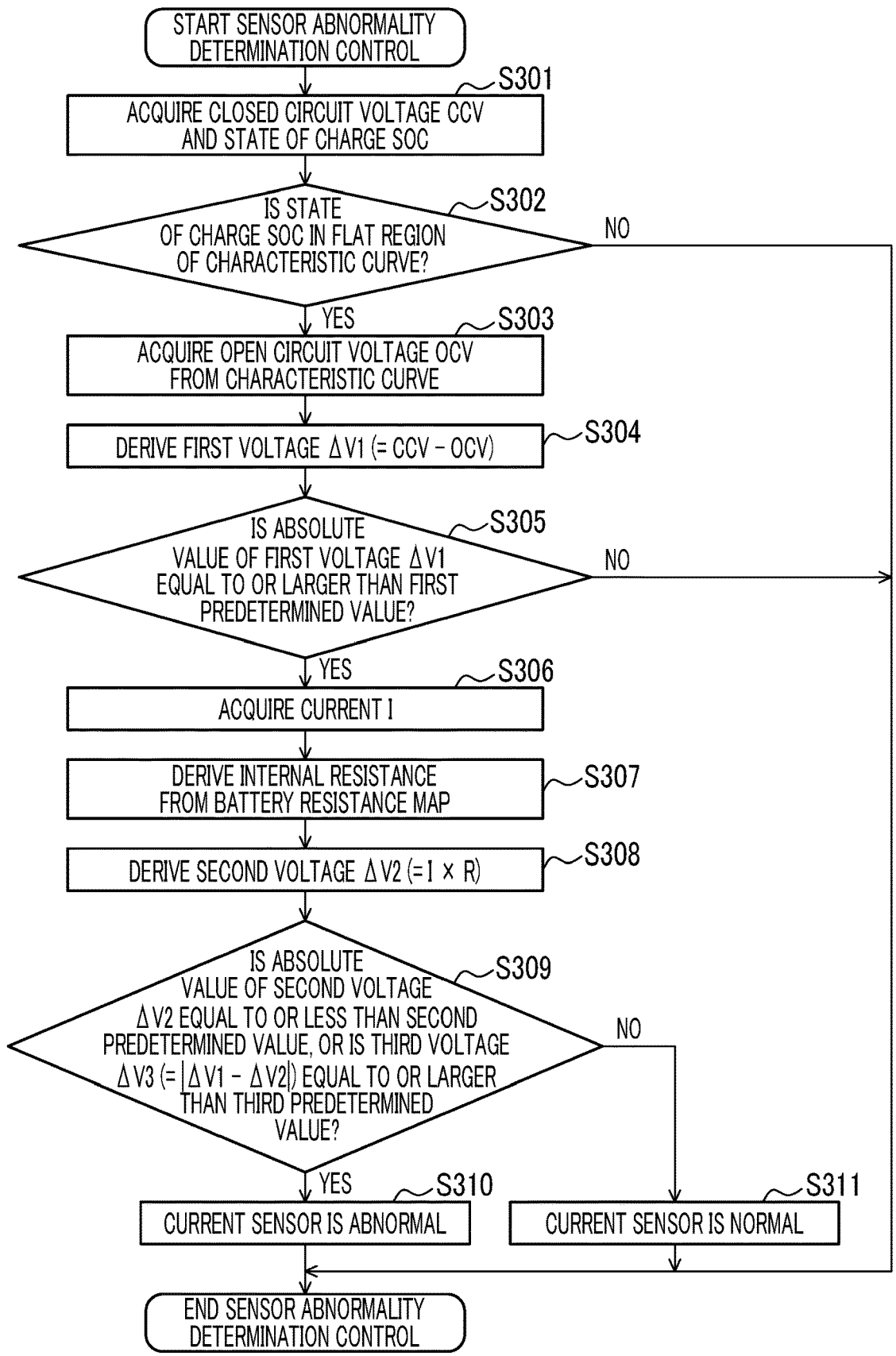
FIG. 3 is a flowchart showing a process procedure of control executed by the sensor abnormality determination device.

The control performed by the sensor abnormality determination device 50 according to the embodiment will be described with further reference to FIG. 3. FIG. 3 is a flowchart showing a process procedure of the control for determining the abnormality in the current sensor, which is executed by the sensor abnormality determination device 50 (each of the acquisition unit 51, the derivation unit 52, and the determination unit 53).

The sensor abnormality determination control shown in FIG. 3 can be repeatedly executed at, for example, a constant cycle regardless of a state of the vehicle (traveling, stopping, parking).

Step S301: The sensor abnormality determination device 50 acquires the closed circuit voltage CCV and the state of charge SOC of the second battery 30. As described above, the state of charge SOC may be acquired using the well-known OCV method or current integration method. When the closed circuit voltage CCV and the state of charge SOC are acquired, the process proceeds to step S302.

Step S302: The sensor abnormality determination device 50 determines whether or not the state of charge SOC of the second battery 30 is a value in the flat region of the SOC–OCV characteristic curve. When the state of charge SOC is in the flat region, an error of the open circuit voltage OCV derived from the state of charge SOC based on the SOC–OCV characteristic curve can be small and the accuracy of the determination process performed thereafter can be improved, even though there is a difference between the acquired state of charge SOC and an actual state of charge. When the state of charge SOC is in the flat region of the SOC–OCV characteristic curve (Yes in step S302), the process proceeds to step S303. In other cases, the control ends regarding that the current sensor is not in a state of being determined the abnormality thereof.

Step S303: The sensor abnormality determination device 50 acquires the open circuit voltage OCV of the second battery 30 based on the SOC–OCV characteristic curve. As described above, the open circuit voltage OCV can be obtained from the state of charge SOC when the closed circuit voltage CCV is acquired. When the open circuit voltage OCV can be acquired, the process proceeds to step S304.

Figure 4:
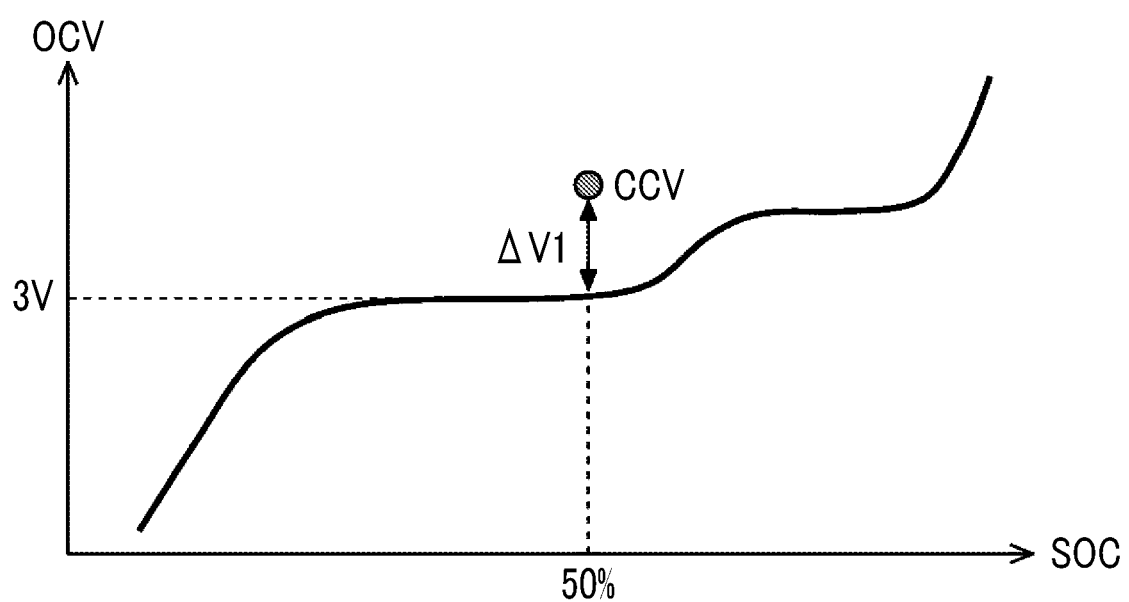
FIG. 4 is a graph illustrating a first voltage difference derived from a closed circuit voltage and an open circuit voltage.

Step S304: The sensor abnormality determination device 50 derives the first voltage difference $\Delta V1 (=CCV-OCV)$ from the closed circuit voltage CCV and the open circuit voltage OCV. A voltage fluctuation amount of the second battery 30 based on the voltage value detected by the voltage sensor can be obtained from the first voltage difference $\Delta V1$. FIG. 4 is a diagram illustrating the first voltage difference $\Delta V1$ derived from the closed circuit voltage CCV and the open circuit voltage OCV. FIG. 4 shows a case where a current flows into the second battery 30 (charge state), and thus the closed circuit voltage CCV is higher than the open circuit voltage OCV. However, when the current flows out of the second battery 30 (discharge state), the closed circuit voltage CCV becomes lower than the open circuit voltage OCV. When the first voltage difference $\Delta V1$ is derived, the process proceeds to step S305.

Step S305: The sensor abnormality determination device 50 determines whether an absolute value of the first voltage difference $\Delta V1$ is equal to or larger than a first predetermined value. The first predetermined value is provided to exclude a case where the current flowing into and out of the second battery 30 is small, for which the abnormality in the current sensor is difficult to be determined, and can be set based on a small amount of current constantly consumed by the in-vehicle devices. When the absolute value of the first voltage difference $\Delta V1$ is equal to or larger than the first predetermined value (Yes in step S305), the process proceeds to step S306. In other cases, the control ends regarding that the current sensor is not in a state of being determined the abnormality thereof.

Step S306: The sensor abnormality determination device 50 acquires the current I detected by the current sensor of the battery monitoring unit 31. When the current I is acquired, the process proceeds to step S307.

Step S307: The sensor abnormality determination device 50 derives the internal resistance R of the second battery 30 from a predetermined battery resistance map. The sensor abnormality determination device 50 acquires the temperature T, the state of charge SOC, the deterioration degree, and the like of the second battery 30, which are requested for deriving the internal resistance R, from the battery monitoring unit 31. When the internal resistance R is derived, the process proceeds to step S308.

Step S308: The sensor abnormality determination device 50 derives the second voltage difference $\Delta V2 (=I \times R)$ from the current I and the internal resistance R of the second battery 30. The voltage fluctuation amount of the second battery 30 based on the current value detected by the current sensor can be obtained from the second voltage difference $\Delta V2$. When the second voltage difference $\Delta V2$ is derived, the process proceeds to step S309.

Step S309: The sensor abnormality determination device 50 determines whether a deviation between the first voltage difference $\Delta V1$ and the second voltage difference $\Delta V2$ is larger than a predetermined value. Specifically, the sensor abnormality determination device 50 determines whether an absolute value of the second voltage difference $\Delta V2$ is equal to or less than a second predetermined value (first determination) and determines whether a third voltage difference $\Delta V3 (=|\Delta V1-\Delta V2|)$ which is an absolute value of a difference between the first voltage difference $\Delta V1$ and the second voltage difference $\Delta V2$ is equal to or larger than a third predetermined value (second determination). When an affirmative determination is made in any one of the first determination and the second determination, the sensor abnormality determination device 50 determines that the deviation between the first voltage difference $\Delta V1$ and the second voltage difference $\Delta V2$ is large.

The first determination is performed for determining a state where the second voltage difference $\Delta V2$, which is the voltage fluctuation amount of the second battery 30 obtained based on the current value, is small (second predetermined value or less) even though the first voltage difference $\Delta V1$, which is the voltage fluctuation amount of the second battery 30 obtained based on the voltage value, is large (first predetermined value or more). Therefore, the second predetermined value is set to be less than the first predetermined value. When the absolute value of the second voltage difference $\Delta V2$ is equal to or less than the second predetermined value (Yes in step S309), the deviation between the first voltage difference $\Delta V1$ and the second voltage difference $\Delta V2$ is determined to be large and the process proceeds to step S310. In other cases (No in step S309), the process proceeds to step S311.

The second determination is performed for determining a state where both the first voltage difference $\Delta V1$, which is the voltage fluctuation amount of the second battery 30 obtained based on the voltage value, and the second voltage difference $\Delta V2$, which is the voltage fluctuation amount of the second battery 30 obtained based on the current value, are large, but the difference between the first voltage difference $\Delta V1$ and the second voltage difference $\Delta V2$ is too large. The third predetermined value is appropriately set according to the magnitude of the difference to be determined. When the third voltage difference $\Delta V3$ is equal to or larger than the third predetermined value (Yes in step S309), the deviation between the first voltage difference $\Delta V1$ and the second voltage difference $\Delta V2$ is determined to be large and the process proceeds to step S310. In other cases (No in step S309), the process proceeds to step S311.

Step S310: The sensor abnormality determination device 50 determines that there is the abnormality in the current sensor and ends the control. The abnormality may be, for example, sticking of the current sensor. In this determination case, the sensor abnormality determination device 50 may perform a measure such as disconnecting the current sensor from the power supply system 1 or may notify an occupant of the vehicle of the abnormality in the current sensor through display, sound, or the like.

Step S311: The sensor abnormality determination device 50 determines that there is no abnormality in the current sensor and ends the control.

In the above embodiment, when the affirmative determination is made in any one of the first determination and the second determination in the process of step S309, the current sensor is immediately determined to be abnormal. However, for example, when the determination result of the process of step S309 is stored and the affirmative determination result reaches a predetermined number, the current sensor may be determined to be abnormal. When negative determination is made in both the first determination and the second determination in the process of step S309 after determination is made that there is the abnormality in the current sensor, determination may be made again that there is no abnormality in the current sensor.

Action/Effect

As described above, with the sensor abnormality determination device 50 according to the embodiment of the disclosure, when a difference value (first voltage difference $\Delta V1$) between an actual closed circuit voltage CCV appearing at an input and output terminal of the second battery 30 and the open circuit voltage OCV estimated from the state of charge SOC and the SOC–OCV characteristic curve is equal to or larger than a predetermined value (first predetermined value), that is, the second battery 30 is estimated to perform the charge and discharge by flowing in and out of a large amount of current, the process of determining the abnormality in the current sensor is performed.

With this process, when the current flowing out of the battery is smaller than the predetermined value, for which it is difficult to clearly determine whether the cause is the abnormality in the current sensor or the small amount of current consumption by a specific device, the abnormality determination is not performed. Therefore, it is possible to improve the accuracy of determining that the current sensor is abnormal.

With the sensor abnormality determination device 50 according to the embodiment, the voltage fluctuation amount (second voltage difference ΔV2) of the second battery 30 obtained based on the current I actually detected by the current sensor and the estimated current value due to the internal resistance R is also derived in addition to the voltage fluctuation amount (first voltage difference ΔV1) of the second battery 30 obtained based on the voltage values of the closed circuit voltage CCV and the open circuit voltage OCV, and the deviation between the voltage fluctuation amounts or the like is further determined.

As described above, the presence or absence of the abnormality in the current sensor is determined based on both a voltage drop or voltage increase of the second battery 30 obtained using the current I detected by the current sensor and a voltage drop or voltage increase of the second battery 30 obtained without using the current I. Therefore, it is possible to determine the abnormality in the current sensor with high accuracy.

As described above, the embodiment of the disclosure has been described. However, the disclosure is not limited to the sensor abnormality determination device, but can be understood as a sensor abnormality determination method executed by the sensor abnormality determination device including the processor and the memory, a control program of the method, a computer-readable non-transitory recording medium storing the control program, a vehicle equipped with the sensor abnormality determination device, or the like.

The sensor abnormality determination device according to the aspect of the disclosure can be used for vehicles such as hybrid vehicles, plug-in hybrid vehicles, and electric vehicles.

What is claimed is:

1. A sensor abnormality determination device that determines abnormality in a current sensor that detects a current of a battery, the device comprising:
    an acquisition unit configured to acquire a closed circuit voltage of the battery and acquires an open circuit voltage of the battery obtained from a state of charge of the battery when the closed circuit voltage is acquired based on a predetermined state of charge (SOC)–open circuit voltage (OCV) characteristic curve indicating a relationship between the state of charge and the open circuit voltage of the battery;
    a derivation unit configured to derive a first voltage difference which is a difference value between the closed circuit voltage and the open circuit voltage and a second voltage difference which is a change amount of a voltage obtained from a current of the battery detected by the current sensor and an internal resistance; and
    a determination unit configured to determine whether the current sensor is abnormal based on the first voltage difference and the second voltage difference derived by the derivation unit when the first voltage difference is equal to or larger than a first predetermined value.

2. The sensor abnormality determination device according to claim 1, wherein the determination unit determines that the current sensor is abnormal when an absolute value of the first voltage difference is equal to or larger than the first predetermined value and an absolute value of the second voltage difference is equal to or less than a second predetermined value, or a third voltage difference which is an absolute value of a difference between the first voltage difference and the second voltage difference is equal to or larger than a third predetermined value.

3. The sensor abnormality determination device according to claim 1, wherein:
    the SOC–OCV characteristic curve has a flat region where a change rate of the open circuit voltage with respect to the state of charge of the battery is equal to or less than a fourth predetermined value; and
    the determination unit determines whether the current sensor is abnormal when the state of charge of the battery when the acquisition unit acquires the closed circuit voltage is in the flat region.

4. The sensor abnormality determination device according to claim 1, wherein the derivation unit derives the second voltage difference based on the internal resistance of the battery obtained based on a temperature, a state of charge, and a deterioration degree of the battery, and the current of the battery.

* * * * *